(12) United States Patent
Ohido

(10) Patent No.: US 7,758,766 B2
(45) Date of Patent: Jul. 20, 2010

(54) MAGNETIC GARNET SINGLE CRYSTAL AND FARADAY ROTATOR USING THE SAME

(75) Inventor: Atsushi Ohido, Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 11/898,858

(22) Filed: Sep. 17, 2007

(65) Prior Publication Data

US 2009/0073549 A1    Mar. 19, 2009

(51) Int. Cl.
C04B 35/40    (2006.01)
C04B 35/26    (2006.01)
H01F 1/00     (2006.01)
C30B 11/00    (2006.01)
C30B 19/00    (2006.01)

(52) U.S. Cl. ............... 252/62.57; 252/62.6; 252/62.63; 252/62.59; 117/942

(58) Field of Classification Search .............. 252/62.57, 252/62.6; 117/11, 54, 942
See application file for complete search history.

(56) References Cited

U.S. PATENT DOCUMENTS

| | | | |
|---|---|---|---|
| 4,077,832 A | | 3/1978 | Robertson et al. |
| 4,402,787 A | | 9/1983 | Matsuzawa et al. |
| 4,444,615 A | | 4/1984 | Matsuzawa et al. |
| 4,519,870 A | | 5/1985 | Matsuzawa et al. |
| 4,698,820 A | * | 10/1987 | Brandle et al. ............ 372/41 |
| 5,920,420 A | | 7/1999 | Ishikura et al. |
| 6,059,878 A | | 5/2000 | Takeda et al. |
| 6,527,973 B2 | | 3/2003 | Ohido et al. |
| 6,775,052 B2 | | 8/2004 | Sugawara et al. |
| 6,853,473 B2 | | 2/2005 | Ohido et al. |
| 6,875,270 B2 | | 4/2005 | Ohido et al. |
| 7,022,303 B2 | | 4/2006 | Riman et al. |
| 7,133,189 B2 | * | 11/2006 | Ohido et al. ............ 359/324 |
| 7,187,496 B2 | | 3/2007 | Sugawara et al. |
| 7,242,516 B2 | | 7/2007 | Sugawara et al. |
| 7,280,264 B2 | | 10/2007 | Goto et al. |
| 7,333,261 B2 | | 2/2008 | Ohido et al. |
| 7,517,406 B2 | | 4/2009 | Ohido et al. |
| 2003/0211369 A1 | | 11/2003 | Riman et al. |
| 2003/0219261 A1 | | 11/2003 | Ohido et al. |
| 2006/0112873 A1 | | 6/2006 | Uchida et al. |
| 2007/0002425 A1 | | 1/2007 | Goto et al. |
| 2007/0160875 A1 | | 7/2007 | Ohido |
| 2007/0193504 A1 | * | 8/2007 | Ohido ..................... 117/49 |
| 2008/0095686 A1 | | 4/2008 | Ohido |
| 2009/0294682 A1 | | 12/2009 | Perna |
| 2009/0294683 A1 | | 12/2009 | Perna |

FOREIGN PATENT DOCUMENTS

| | | |
|---|---|---|
| CN | 1439749 A | 9/2003 |
| DE | 2 318 798 | 10/1973 |
| EP | 0 208 476 A2 | 1/1987 |
| JP | B2-57-045719 | 9/1982 |
| JP | B2-06-46604 | 6/1994 |
| JP | A-09-202697 | 8/1997 |
| JP | A-10-072296 | 3/1998 |
| JP | A-2000-086396 | 3/2000 |
| JP | A-2001-044026 | 2/2001 |
| JP | A-2001-044027 | 2/2001 |
| JP | A-2004-083390 | 3/2004 |
| JP | A-2004-269305 | 9/2004 |
| JP | A-2006-169093 | 6/2006 |
| WO | WO 2005/056887 A1 | 6/2005 |
| WO | WO 2006/054628 A1 | 5/2006 |

OTHER PUBLICATIONS

Park et al., "Growth of epitaxial garnet film by LPE for application to integrated magneto-optic light switch arrays." *Physica Status Solidi A: Applied Research*, Jun. 2004, vol. 201, No. 8, p. 1976-1979.
Robertson, J.M.; Improvement of the Lead-Free Flux Systems for the Growth of Bismuth-Substituted Iron Garnet Films by Liquid Phase Epitaxy; Journal of the Electrochemical Society; vol. 123, No. 8; Aug. 1976; pp. 1248-1249.
Office Action for U.S. Appl. No. 11/666,331, mailed Nov. 17, 2009.
Office Action for U.S. Appl. No. 11/704,192; mailed Feb. 24, 2010.
European Search Report for Application No. 07001472.5; mailed May 17, 2010.

* cited by examiner

*Primary Examiner*—C. Melissa Koslow
*Assistant Examiner*—Matthew E Hoban
(74) *Attorney, Agent, or Firm*—Oliff & Berridge, PLC

(57) ABSTRACT

It is an object of the present invention to provide a magnetic garnet single crystal capable of reducing the optical loss of the resulting rotator even when the magnetic garnet single crystal is grown using a solvent containing Na by the liquid phase epitaxial process, as well as a Faraday rotator using the same. A magnetic garnet single crystal represented by the chemical formula $Bi_\alpha Na_\beta M1_{3-\alpha-\beta-\gamma} M2_\gamma Fe_{5-\delta-\epsilon} Mg_\delta M3_\epsilon O_{12}$ (M1 is at least one element or more selected from Y, Eu, Gd, Tb, Dy, Ho, Yb and Lu; and M2 is at least one element or more selected from Ca and Sr; M3 is at least one element or more selected from Si, Ge, Ti, Pt, Ru, Sn, Hf and Zr, provided that $0.60 < \alpha \leq 1.50$, $0 < \beta \leq 0.05$, $1.35 < 3-\alpha-\beta-\gamma < 2.40$, $0 \leq \gamma \leq 0.10$, $0 \leq \delta \leq 0.10$, $0 < \epsilon \leq 0.10$, $0 < \gamma+\delta \leq 0.10$, $0 < \delta+\epsilon \leq 0.10$).

8 Claims, 2 Drawing Sheets

FIG. 1

| | Element M1 | Element M2 or Mg | Element M3 | M3/(2Na+M2+Mg) | Garnet single crystals | | | |
|---|---|---|---|---|---|---|---|---|
| | | | | | Na amount β | M2 amount γ | Mg amount δ | M3 amount ε |
| Example 1 | Gd,Yb | Ca | Ge | 0.50 | 0.0100 | 0.0010 | 0.0000 | 0.0105 |
| Example 2 | Gd,Yb | Ca | Ge | 0.65 | 0.0120 | 0.0110 | 0.0000 | 0.0228 |
| Example 3 | Gd,Yb | Ca | Ge | 0.32 | 0.0090 | 0.0005 | 0.0000 | 0.0059 |
| Example 4 | Gd,Yb | Ca | Ge | 0.85 | 0.0080 | 0.0050 | 0.0000 | 0.0179 |
| Example 5 | Gd,Yb | Ca | Ge | 0.20 | 0.0040 | 0.0003 | 0.0000 | 0.0017 |
| Example 6 | Gd,Yb | Ca | Ge | 0.95 | 0.0020 | 0.0250 | 0.0000 | 0.0276 |
| Example 7 | Gd,Yb | Ca | Ge | 0.15 | 0.0030 | 0.0002 | 0.0000 | 0.0009 |
| Example 8 | Gd,Yb | Ca | Ge | 1.00 | 0.0020 | 0.0500 | 0.0000 | 0.0540 |
| Example 9 | Gd,Yb | Ca | Si | 0.50 | 0.0100 | 0.0010 | 0.0000 | 0.0105 |
| Example 10 | Gd,Yb | Ca | Ti | 0.50 | 0.0100 | 0.0010 | 0.0000 | 0.0105 |
| Example 11 | Gd,Yb | Ca | Pt | 0.50 | 0.0100 | 0.0010 | 0.0000 | 0.0105 |
| Example 12 | Gd,Yb | Ca | Ru | 0.50 | 0.0100 | 0.0010 | 0.0000 | 0.0105 |
| Example 13 | Gd,Yb | Ca | Sn | 0.50 | 0.0100 | 0.0010 | 0.0000 | 0.0105 |
| Example 14 | Gd,Yb | Ca | Hf | 0.50 | 0.0100 | 0.0010 | 0.0000 | 0.0105 |
| Example 15 | Gd,Yb | Ca | Zr | 0.50 | 0.0100 | 0.0010 | 0.0000 | 0.0105 |
| Example 16 | Gd,Yb | Sr | Ge | 0.50 | 0.0100 | 0.0010 | 0.0000 | 0.0105 |
| Example 17 | Gd,Yb | Mg | Ge | 0.50 | 0.0100 | 0.0000 | 0.0010 | 0.0105 |
| Example 18 | Gd,Yb | Ca,Mg | Ge,Ti | 0.50 | 0.0100 | 0.0005 | 0.0005 | 0.0105 |
| Example 19 | Tb,Ho | Ca | Ge | 0.50 | 0.0100 | 0.0010 | 0.0000 | 0.0105 |
| Example 20 | Eu,Y | Ca | Ge | 0.50 | 0.0100 | 0.0010 | 0.0000 | 0.0105 |
| Example 21 | Gd,Lu | Ca | Ge | 0.50 | 0.0100 | 0.0010 | 0.0000 | 0.0105 |
| Comparative Example 1 | Gd,Yb | - | Ge | 1.00 | 0.0040 | 0.0000 | 0.0000 | 0.0080 |

FIG. 2

|  | Faraday rotators | | | Reproducibility of optical loss |
|---|---|---|---|---|
|  | Optical loss (dB) | | | |
|  | Minimum value | Typical value | Maximum value | |
| Example 1 | 0.00 | 0.01 | 0.02 | Good |
| Example 2 | 0.00 | 0.01 | 0.02 | Good |
| Example 3 | 0.00 | 0.02 | 0.03 | Good |
| Example 4 | 0.00 | 0.02 | 0.03 | Good |
| Example 5 | 0.01 | 0.03 | 0.05 | Good |
| Example 6 | 0.01 | 0.03 | 0.05 | Good |
| Example 7 | 0.01 | 0.04 | 0.08 | Good |
| Example 8 | 0.01 | 0.04 | 0.08 | Good |
| Example 9 | 0.00 | 0.01 | 0.02 | Good |
| Example 10 | 0.00 | 0.01 | 0.02 | Good |
| Example 11 | 0.00 | 0.01 | 0.02 | Good |
| Example 12 | 0.00 | 0.01 | 0.02 | Good |
| Example 13 | 0.00 | 0.01 | 0.02 | Good |
| Example 14 | 0.00 | 0.01 | 0.02 | Good |
| Example 15 | 0.00 | 0.01 | 0.02 | Good |
| Example 16 | 0.00 | 0.01 | 0.02 | Good |
| Example 17 | 0.00 | 0.01 | 0.02 | Good |
| Example 18 | 0.00 | 0.01 | 0.02 | Good |
| Example 19 | 0.00 | 0.01 | 0.02 | Good |
| Example 20 | 0.00 | 0.01 | 0.02 | Good |
| Example 21 | 0.00 | 0.01 | 0.02 | Good |
| Comparative Example 1 | 0.01 | 0.05 | 0.09 | Reduced |

MAGNETIC GARNET SINGLE CRYSTAL AND FARADAY ROTATOR USING THE SAME

BACKGROUND OF THE INVENTION

1. Field of the Invention

The present invention relates to a magnetic garnet single crystal grown by the liquid phase epitaxial process (LPE process) and a Faraday rotator using the same.

2. Description of the Related Art

Faraday rotator is used as an optical element for rotating the polarization direction of light to 45 degrees (deg.) in optical isolators, optical circulators and the like for communication. Faraday rotator is generally prepared by polishing a magnetic garnet single crystal grown by the LPE process to a Faraday rotation angle of 45 deg. and then preparing an anti-reflection film on the face thereof for optical incidence/emission.

As a solvent in growing a magnetic garnet single crystal by the LPE process, lead oxide (PbO) is used together with boron oxide ($B_2O_3$) and bismuth oxide ($Bi_2O_3$). During the growth of the magnetic garnet single crystal, therefore, a small amount of lead (Pb) contaminates the resulting crystal.

So as to comply with the recent environmental regulations, however, efforts are now directed toward the reduction of the content of Pb as an environmental load substance in such Faraday rotators. Consequently, a technique for using sodium (Na) in place of Pb as a solvent material for growing a magnetic garnet single crystal by the LPE process is under way of establishment. See non-patent reference 1: PARK J. H., Growth of epitaxial garnet film by LPE for application to integrated magneto-optic light switch arrays, Physica Status Solidi A: Applied Research, June 2004, Vol. 201, No. 8, pp. 1976-1979, CODEN: PSSABA: ISSN: 0031-8965.

When Na is used as the solvent, however, a small amount of Na contaminates the resulting garnet single crystal film, leading to the occurrence of optical absorption in the single crystal. Then, a Faraday rotator prepared from the garnet single crystal with such optical absorption has an increase in the optical loss. When a Faraday rotator with a large optical loss is used to prepare an optical device for communication, such as optical isolator, the device profile is disadvantageously deteriorated.

Therefore, the optical loss is now reduced by adding elements becoming tetravalent cations (positive ions) for the charge compensation together with Na, including for example Si, Ge, Ti and Pt, to such garnet single crystal.

However, it has been found that simple addition of such tetravalent cations stable at those valence states causes a large variation of the optical loss of the resulting Faraday rotators, so that not any Faraday rotators with optical losses reduced at their minimums can be produced at high reproducibility.

Devices such as in-line optical isolator toward which a small optical loss is required should require a Faraday rotator with a particularly low optical loss. For such use, it is an issue to produce a Faraday rotator with a small optical loss at high reproducibility.

SUMMARY OF THE INVENTION

It is an object of the invention to provide a magnetic garnet single crystal from which a Faraday rotator with a small optical loss can be produced at high reproducibility even when the magnetic garnet single crystal is grown using a solvent containing Na, as well as a Faraday rotator using the same.

The object is attained with a magnetic garnet single crystal represented by the chemical formula $Bi_\alpha Na_\beta M1_{3-\alpha-\beta-\gamma} M2_\gamma Fe_{5-\delta-\epsilon} Mg_\delta M3_\epsilon O_{12}$ (M1 is at least one element or more selected from Y, Eu, Gd, Tb, Dy, Ho, Yb and Lu; and M2 is at least one element or more selected from Ca and Sr; M3 is at least one element or more selected from Si, Ge, Ti, Pt, Ru, Sn, Hf and Zr, provided that $0.60<\alpha\leq1.50$, $0<\beta\leq0.05$, $1.35<3-\alpha-\beta-\gamma<2.40$, $0\leq\gamma\leq0.10$, $0\leq\delta\leq0.10$, $0<\epsilon\leq0.10$, $0<\gamma+\delta\leq0.10$, $0<\delta+\epsilon\leq0.10$).

The magnetic garnet single crystal in accordance with the invention is characteristic in that the magnetic garnet single crystal satisfies the formula $0<\epsilon/(2\beta+\gamma+\delta)\leq1.00$.

The magnetic garnet single crystal in accordance with the invention is characteristic in that the magnetic garnet single crystal satisfies the formula $0.20\leq\epsilon/(2\beta+\gamma+\delta)\leq0.95$.

The magnetic garnet single crystal in accordance with the invention is characteristic in that the magnetic garnet single crystal satisfies the formula $0.30\leq\epsilon/(2\beta+\gamma+\delta)\leq0.90$.

The object is attained with a Faraday rotator prepared from any one of the above-mentioned magnetic garnet single crystal.

In accordance with the invention, the optical loss of the Faraday rotator prepared from a magnetic garnet single crystal grown using a solvent containing Na can be reduced at high reproducibility.

BRIEF DESCRIPTION OF THE DRAWINGS

FIG. 1 is a table collectively showing the types of the elements M1, M2 or Mg and M3 in the Examples 1 through 21 as modes for carrying out the invention and the Comparative Example 1 as well as the Na amount $\beta$, the M2 amount $\gamma$, the Mg amount $\delta$, the M3 amount $\epsilon$ in the grown garnet single crystals and the values of the relation formula (M3/(2Na+M2+Mg)). Additionally, FIG. 2 shows the optical losses (dB) of the prepared Faraday rotators and the reproducibility of the optical losses in the Examples 1 through 21 as modes for carrying out the invention and the Comparative Example 1.

DESCRIPTION OF PREFERRED EMBODIMENTS

Description is now made about a magnetic garnet single crystal in one mode for carrying out the invention and a Faraday rotator using the same. Using a solvent containing sodium hydroxide (NaOH), $Bi_2O_3$ and $B_2O_3$, a single crystal of $(BiGdYb)_3Fe_5O_{12}$ was grown by the LPE process. The resulting single crystal was processed into a Faraday rotator, where light at a wavelength of 1.55 μm was incident to measure the optical loss (insertion loss). The optical loss was about 3 dB.

In contrast, the optical loss of a Faraday rotator prepared from a single crystal of $(BiGdYb)_3Fe_5O_{12}$ grown by the LPE process using a solvent containing Pb can be reduced to 0.05 dB or less. This indicates that the optical loss of the garnet single crystal grown using a solvent containing Na is very large. The composition was analyzed by fluorescence X-ray analysis. Na was detected at 100 to 300 ppm in the garnet single crystal grown using a solvent containing Na. All cations (positive ions) composing Bi-substituted rare earth-iron garnet (referred to as "Bi—Fe garnet" hereinbelow) single crystals are essentially trivalent. When Na at a stable state of monovalence enters into a garnet single crystal, therefore, the charge balance is deteriorated so that the garnet single crystal becomes a semiconductor. This causes optical absorption in the garnet single crystal containing Na.

So as to reduce the optical absorption, effectively, the charge compensation is done by adding elements becoming divalent cations, such as calcium (Ca), strontium (Sr), and magnesium (Mg), to a garnet single crystal and additionally adding elements becoming tetravalent cations in stable fashions, such as silicon (Si), germanium (Ge), titanium (Ti), platinum (Pt), ruthenium (Ru), tin (Sn), hafnium (Hf), and zirconium (Zr), to the garnet single crystal. By suppressing the optical absorption of a garnet single crystal, the optical loss of the resulting Faraday rotator may possibly be reduced. Si, Ge, Ti, Pt, Ru, Sn, Hf and Zr are stable in their tetravalent states in garnet single crystals, which work for the charge compensation for monovalent Na and divalent Ca, Sr and Mg, so that the optical absorption can be reduced.

In the Bi—Fe garnet single crystals, cations of Bi, Fe and rare earth elements compose the crystals at their essentially trivalent states. So as to promote the charge compensation by adding tetravalent cations to monovalent Na cation present in the Bi—Fe garnet single crystals, it is required stoichiometrically that the relation represented by the formula $2\beta=\delta$ can be established provided that $\beta$ represents the amount of Na and $\delta$ represents the amount of tetravalent cations. Even when the individual amounts of Na and elements becoming tetravalent cations satisfied the relation in a garnet single crystal, however, the optical loss of a Faraday rotator prepared from the resulting garnet single crystal could not be reduced to minimum at high reproducibility.

When an LPE film was grown by adding elements becoming divalent cations such as Ca, Sr and Mg to a solution containing Na and elements becoming tetravalent cations, alternatively, it was shown that the optical absorption of the resulting garnet single crystal could be reduced. Accordingly, examinations were done about the optical loss and its variance of a Faraday rotator prepared by selecting germanium (Ge) as an element becoming tetravalent cation under conditions with variable values from the relation formula for Na, Ca and Ge (Ge/(2Na+Ca)) in a garnet single crystal, for screening for growth conditions for effectively reducing the optical absorption. The contents of Na, Ca and Ge in garnet were changed by modifying the Na amount, the Ca amount and the Ge amount in a solution. Consequently, it was shown that the optical loss was likely reduced under a condition such that the relation formula (Ge/(2Na+Ca)) was 1 or less.

More detailed analysis of the relation between the formula (Ge/(2Na+Ca)) and the optical loss was done. So as to prepare a Faraday rotator with an extremely small optical loss of 0.03 dB or less at high reproducibility, it was revealed that the relation formula (Ge/(2Na+Ca)) should be 0.30 or more to 0.90 or less. Conditions were determined for preparing a Faraday rotator with a sufficiently low optical loss of 0.05 dB or less at high reproducibility. It was then shown that the relation formula (Ge/(2Na+Ca)) was desirably 0.20 or more to 0.95 or less.

Elements to be added for the charge compensation are suitably elements becoming divalent cations and those becoming tetravalent cations in a garnet single crystal, which are also required to be substitutable with rare earth elements and Fe in the Bi—Fe garnet single crystal. Such elements becoming divalent cations include for example Ca, Sr and Mg, while elements M3 becoming tetravalent cations include for example Si, Ge, Ti, Pt, Ru, Sn, Hf and Zr. Since elements with ionic radii similar to each other are substitutable with each other, Ca and Sr (generally referred to as M2 hereinafter) are substituted with rare earth elements or Bi, while the elements M3 and Mg are substituted with Fe.

So as to adjust the value of the relation formula (M3/(2Na+M2+Mg)) to 0.50, a combination of these elements was used to grow a garnet single crystal to prepare a Faraday rotator. The optical losses of the Faraday rotators thus prepared were assessed. The optical losses of all the Faraday rotators were at smaller values at high reproducibility.

The element M2 becoming a divalent cation in a garnet single crystal has the same effect as Ca has, while the element M3 becoming a tetravalent cation has the same effect as Ge has. Accordingly, the optical loss of the rotator can effectively be reduced at high reproducibility when the value of the relation formula (M3/(2Na+M2+Mg)) is 1.00 or less.

The optical loss of a Faraday rotator prepared under conditions so as to adjust the (M3/(2Na+M2+Mg)) to 0.30 or more to 0.90 or less can be reduced to minimum at high reproducibility; a Faraday rotator with a sufficiently small optical loss can be prepared at high reproducibility under conditions so as to adjust the (M3/(2Na+M2+Mg)) to 0.20 or more to 0.95 or less. These effects are also realized with a combination of plural elements M2s and M3s becoming divalent and tetravalent cations, respectively and/or Mg. In a composition with addition of Ca and Mg together with Ge and Ti, the (M3/(2Na+M2+Mg)) can be calculated on a basis of ((Ge+Ti)/(2Na+Ca+Mg)).

Because the increase of the Bi amount contained in a garnet single crystal causes the increase in the Faraday rotation coefficient (deg./µm), the thickness of the prepared Faraday rotator can be made smaller. Alternatively, the decrease of the Bi amount makes the Faraday rotation coefficient smaller, leading to a relatively large thickness of the resulting Faraday rotator. So as to prepare a Faraday rotator with a large thickness, a Bi—Fe garnet single crystal film of a larger thickness is required. When the growth of such single crystal film of a large thickness is attempted, cracks readily emerge in the resulting single crystal. Thus, it is not preferable to grow a single crystal film of a larger thickness. So as to prepare a Bi—Fe garnet single crystal of a rotation coefficient at minimum for use in a Faraday rotator, it is required that the Bi amount is at least 0.60 or more based on the Bi amount in the chemical formula. When the growth of a garnet single crystal at a Bi amount of more than 1.50 is attempted, the supersaturation state of the solution as required for growing the single crystal cannot be maintained in a stable manner, leading to a difficulty in growing a Bi—Fe garnet single crystal. Thus, preferably, the Bi amount is adjusted to 0.60 or more to 1.50 or less.

So as to adjust the Na amount contained in a garnet single crystal to more than 0.05 based on the Na amount in the chemical formula, elements becoming tetravalent cations should necessarily be added at a vast amount. When elements becoming tetravalent cations are added at a vast amount, the charge balance is deteriorated, leading to a higher level of optical absorption. Thus, the Na amount is preferably adjusted to 0.05 or less.

Ca and Sr are elements to be substituted with Bi or rare earth elements in the Bi—Fe garnet single crystal. Bi is an element essential for the Bi—Fe garnet single crystal. Even when the rare earth elements are mostly substituted with Ca and Sr, the resulting product may function as a Faraday rotator. So as to replace a Faraday rotator containing lead in the related art with a Faraday rotator never containing lead, however, the dimension, optical profile and magnetic profile of the resulting Faraday rotator are preferably identical to those of the Faraday rotator in the related art. So as to reproduce the profiles of the Faraday rotator containing lead in the related art with a Faraday rotator never containing lead, preferably, the composition of rare earth elements should be retained. Accordingly, the content of Ca and Sr to be substituted with rare earth elements is preferably adjusted to 0.10 or less.

Mg is an element substitutable with Fe in Bi—Fe garnet single crystals. It is possible to increase the Mg content within a range such that the Curie point of Bi—Fe garnet single crystals can be maintained above ambient temperature. So as to reproduce the magnetic profile of a Faraday rotator containing lead in the related art with a Faraday rotator never containing lead, the content of the element M3 substitutable with Fe in combination with Mg is preferably adjusted to 0.10 or less. Thus, the upper limit of each of the element M3 and Mg is preferably adjusted to 0.10 or less.

The element M1 is at least one element or more selected from the group consisting of yttrium (Y), europium (Eu), gadolinium (Gd), terbium (Tb), holmium (Ho), ytterbium (Yb), and lutetium (Lu). As the element M1, the selection of any of lanthanum (La), cerium (Ce), praseodymium (Pr), neodymium (Nd), samarium (Sm), dysprosium (Dy), erbium (Er) and thulium (Tm) may be possible. From the standpoint of the effects in improving Faraday rotator profiles such as magnetic profile, optical profile and Faraday rotation coefficients, at least one element or more selected from Y, Eu, Gd, Tb, Ho, Yb and Lu are preferably used as rare earth element materials for Bi—Fe garnet single crystals.

The magnetic garnet single crystal in one mode for carrying out the invention and a Faraday rotator using the same are more specifically described with reference to Examples and Comparative Example.

First, at least one or more were selected from gadolinium oxide ($Gd_2O_3$), ytterbium oxide ($Yb_2O_3$), terbium oxide ($Tb_2O_3$), holmium oxide ($Ho_2O_3$), europium oxide ($Eu_2O_3$), yttrium oxide ($Y_2O_3$), and lutetium oxide ($Lu_2O_3$) as oxides of rare earth elements M1s (M1 is at least one element or more selected from Y, La, Ce, Pr, Nd, Sm, Eu, Gd, Tb, Dy, Ho, Er, Tm, Yb and Lu), which were added to a gold (Au) crucible (see FIG. 1).

Additionally, iron oxide ($Fe_2O_3$), boron oxide ($B_2O_3$), bismuth oxide ($Bi_2O_3$) and sodium hydroxide (NaOH) were charged in the same crucible. Then, the amount of NaOH blended was adjusted to a range of 10 to 24 mol % on the Na amount basis.

Further, at least one or more of calcium carbonate ($CaCO_3$) and strontium carbonate ($SrCO_3$) as compounds of the element M2 stably becoming divalent cation in a garnet single crystal were charged in the same crucible or at least one or more of calcium carbonate ($CaCO_3$), strontium carbonate ($SrCO_3$) and magnesium oxide (MgO) were charged in the same crucible. Furthermore, at least one or more of germanium oxide ($GeO_2$), silicon oxide ($SiO_2$), titanium oxide ($TiO_2$), platinum oxide ($PtO_2$), ruthenium oxide ($RuO_2$), tin oxide ($SnO_2$), hafnium oxide ($HfO_2$) and zirconium oxide ($ZrO_2$) as oxides of the element M3 becoming tetravalent cation were added to the same crucible (see FIG. 1).

Then, the blend amounts of individual oxides of the element M2 and Mg and those of the element M3 were adjusted so as to adjust the relation formula (M3/(2Na+M2+Mg)) as calculated from the element M2 becoming divalent cation and Mg, the element M3 becoming tetravalent cation and Na (herein, M2 is at least one element or more selected from Ca and Sr; M3 is at least one element or more selected from Ge, Si, Ti, Pt, Ru, Sn, Hf and Zr) to a range of 0.15 or more to 1.00 or less.

Then, the crucible was placed in an electric furnace. By raising the furnace temperature to 950° C., the materials in the crucible were melted. The resulting melt solution was agitated, using a metal device for agitation.

As a substrate for growing a magnetic garnet single crystal film, a single crystal wafer prepared from an ingot of the garnet single crystal grown by the pull-up process is used. In the Examples, a CaMgZr-substituted GGG (gadolinium.gallium.garnet) single crystal substrate $((GdCa)_3(CaMgZr)_5O_{12})$ is used.

Those described above are common procedures to all the following Examples and the Comparative Example.

Example 1

A CaMgZr-substituted GGG substrate mounted on a gold fixing device was charged in a furnace, of which the temperature was lowered to 845° C. Subsequently, the single face of the substrate was put in contact with a melt solution, for promoting the epitaxial growth for 40 hours. By the same procedures, a total of five single crystal wafers were grown to obtain magnetic garnet single crystal films of a film thickness of 530 to 560 μm. The compositions of the resulting single crystals were analyzed by the ICP (inductively-coupled plasma) analysis method. It was revealed that the compositions were $Bi_{0.9001}Gd_{1.5905}Yb_{0.4984}Na_{0.0100}Ca_{0.0010}Fe_{4.9895}Ge_{0.0105}O_{12}$. The value of the relation formula (Ge/(2Na+Ca)) was 0.50. The surface of the resulting Bi—Fe garnet single crystal films was observed. The single crystal films had gloss with less crystal defects.

The resulting individual single crystal wafers were polished and processed, to prepare five single crystal plates with a Faraday rotation angle of 45 deg. toward light at a wavelength of 1.55 μm. Then, an antireflection film was prepared on the polished face of each single crystal plate. Then, plural Faraday rotators each of 2 mm (longitudinal size)×2 mm (crosswise size) were prepared from each of the single crystal plates. Then, 25 Faraday rotators were drawn out of each single crystal plate. The crystal inside of each of the resulting Faraday rotators in total of 125 was observed with an infrared polarization microscope. No crystal defects were observed. Further, the optical loss of each Faraday rotator was assessed at the incidence of light at a wavelength of 1.55 μm. Three Faraday rotators with an optical loss of 0.00 dB, 82 Faraday rotators with an optical loss of 0.01 dB and 40 Faraday rotators with an optical loss of 0.02 dB were obtained. In accordance with the Example, accordingly, the optical loss with the minimum of 0.00 dB, the maximum of 0.02 dB and the typical (representative) value of 0.01 dB was obtained at high reproducibility. Herein, the term typical value means the value of optical loss measured for the largest sample number.

Example 2

A CaMgZr-substituted GGG substrate mounted on a gold fixing device was charged in a furnace, of which the temperature was lowered to 842° C. Subsequently, the single face of the substrate was put in contact with a melt solution, for promoting the epitaxial growth for 40 hours. By the same procedures, a total of five single crystal wafers were grown to obtain magnetic garnet single crystal films of a film thickness of 530 to 560 μm. The compositions of the resulting single crystals were analyzed by the ICP analysis method. It was revealed that the compositions were $Bi_{0.8992}Gd_{1.6020}Yb_{0.4758}Na_{0.0120}Ca_{0.0110}Fe_{4.9772}Ge_{0.0228}O_{12}$. The value of the relation formula (Ge/(2Na+Ca)) was 0.65. The surface of the resulting Bi—Fe garnet single crystal films was observed. The single crystal films had gloss with less crystal defects.

The resulting individual single crystal wafers were polished and processed, to prepare five single crystal plates with a Faraday rotation angle of 45 deg. toward light at a wavelength of 1.55 μm. Then, an antireflection film was prepared on the polished face of each single crystal plate. Then, plural Faraday rotators each of 2 mm (longitudinal size)×2 mm (crosswise size) were prepared from each of the single crystal plates. Then, 25 Faraday rotators were drawn out of each single crystal plate. The crystal inside of each of the resulting Faraday rotators in total of 125 was observed with an infrared polarization microscope. No crystal defects were observed. Further, the optical loss of each Faraday rotator was assessed at the incidence of light at a wavelength of 1.55 µm. The optical loss with the minimum of 0.00 dB, the maximum of 0.02 dB and the typical value of 0.01 dB was obtained at high reproducibility.

Example 3

A CaMgZr-substituted GGG substrate mounted on a gold fixing device was charged in a furnace, of which the temperature was lowered to 855° C. Subsequently, the single face of the substrate was put in contact with a melt solution, for promoting the epitaxial growth for 40 hours. By the same procedures, a total of five single crystal wafers were grown to obtain magnetic garnet single crystal films of a film thickness of 530 to 560 µm. The compositions of the resulting single crystals were analyzed by the ICP analysis method. It was revealed that the compositions were $Bi_{0.8898}Gd_{1.6268}Yb_{0.4739}Na_{0.0090}Ca_{0.0005}Fe_{4.9941}Ge_{0.0059}O_{12}$. The value of the relation formula (Ge/(2Na+Ca)) was 0.32. The surface of the resulting Bi—Fe garnet single crystal films was observed. The single crystal films had gloss with less crystal defects.

The resulting individual single crystal wafers were polished and processed, to prepare five single crystal plates with a Faraday rotation angle of 45 deg. toward light at a wavelength of 1.55 µm. Then, an antireflection film was prepared on the polished face of each single crystal plate. Then, plural Faraday rotators each of 2 mm (longitudinal size)×2 mm (crosswise size) were prepared from each of the single crystal plates. Then, 25 Faraday rotators were drawn out of each single crystal plate. The crystal inside of each of the resulting Faraday rotators in total of 125 was observed with an infrared polarization microscope. No crystal defects were observed. Further, the optical loss of each Faraday rotator was assessed at the incidence of light at a wavelength of 1.55 µm. The optical loss with the minimum of 0.00 dB, the maximum of 0.03 dB and the typical value of 0.02 dB was obtained at high reproducibility.

Example 4

A CaMgZr-substituted GGG substrate mounted on a gold fixing device was charged in a furnace, of which the temperature was lowered to 855° C. Subsequently, the single face of the substrate was put in contact with a melt solution, for promoting the epitaxial growth for 40 hours. By the same procedures, a total of five single crystal wafers were grown to obtain magnetic garnet single crystal films of a film thickness of 530 to 560 µm. The compositions of the resulting single crystals were analyzed by the ICP analysis method. It was revealed that the compositions were $Bi_{0.8904}Gd_{1.6090}Yb_{0.4876}Na_{0.0080}Ca_{0.0050}Fe_{4.9821}Ge_{0.0179}O_{12}$. The value of the relation formula (Ge/(2Na+Ca)) was 0.85. The surface of the resulting Bi-substituted rare earth iron garnet single crystal films was observed. The single crystal films had gloss with less crystal defects.

The resulting individual single crystal wafers were polished and processed, to prepare five single crystal plates with a Faraday rotation angle of 45 deg. toward light at a wavelength of 1.55 µm. Then, an antireflection film was prepared on the polished face of each single crystal plate. Then, plural Faraday rotators each of 2 mm (longitudinal size)×2 mm (crosswise size) were prepared from each of the single crystal plates. Then, 25 Faraday rotators were drawn out of each single crystal plate. The crystal inside of each of the resulting Faraday rotators in total of 125 was observed with an infrared polarization microscope. No crystal defects were observed. Further, the optical loss of each Faraday rotator was assessed at the incidence of light at a wavelength of 1.55 µm. The optical loss with the minimum of 0.00 dB, the maximum of 0.03 dB and the typical value of 0.02 dB was obtained at high reproducibility.

Example 5

A CaMgZr-substituted GGG substrate mounted on a gold fixing device was charged in a furnace, of which the temperature was lowered to 860° C. Subsequently, the single face of the substrate was put in contact with a melt solution, for promoting the epitaxial growth for 40 hours. By the same procedures, a total of five single crystal wafers were grown to obtain magnetic garnet single crystal films of a film thickness of 530 to 560 µm. The compositions of the resulting single crystals were analyzed by the ICP analysis method. It was revealed that the compositions were $Bi_{0.9010}Gd_{1.5945}Yb_{0.5002}Na_{0.0040}Ca_{0.0003}Fe_{4.9983}Ge_{0.0017}O_{12}$. *The value of the relation formula (Ge/(2Na+Ca)) was 0.20. The surface of the resulting Bi—Fe garnet single crystal films was observed. The single crystal films had gloss with less crystal defects.*

The resulting individual single crystal wafers were polished and processed, to prepare five single crystal plates with a Faraday rotation angle of 45 deg. toward light at a wavelength of 1.55 µm. Then, an antireflection film was prepared on the polished face of each single crystal plate. Then, plural Faraday rotators each of 2 mm (longitudinal size)×2 mm (crosswise size) were prepared from each of the single crystal plates. Then, 25 Faraday rotators were drawn out of each single crystal plate. The crystal inside of each of the resulting Faraday rotators in total of 125 was observed with an infrared polarization microscope. No crystal defects were observed. Further, the optical loss of each Faraday rotator was assessed at the incidence of light at a wavelength of 1.55 µm. The optical loss with the minimum of 0.01 dB, the maximum of 0.05 dB and the typical value of 0.03 dB was obtained at high reproducibility.

Example 6

A CaMgZr-substituted GGG substrate mounted on a gold fixing device was charged in a furnace, of which the temperature was lowered to 870° C. Subsequently, the single face of the substrate was put in contact with a melt solution, for promoting the epitaxial growth for 40 hours. By the same procedures, a total of five single crystal wafers were grown to obtain magnetic garnet single crystal films of a film thickness of 530 to 560 µm. The compositions of the resulting single crystals were analyzed by the ICP analysis method. It was revealed that the compositions were $Bi_{0.9103}Gd_{1.5877}Yb_{0.4750}Na_{0.0020}Ca_{0.0250}Fe_{4.9724}Ge_{0.0276}O_{12}$. The value of the relation formula (Ge/(2Na+Ca)) was 0.95. The surface of the resulting Bi—Fe garnet single crystal films was observed. The single crystal films had gloss with less crystal defects.

The resulting individual single crystal wafers were polished and processed, to prepare five single crystal plates with a Faraday rotation angle of 45 deg. toward light at a wavelength of 1.55 μm. Then, an antireflection film was prepared on the polished face of each single crystal plate. Then, plural Faraday rotators each of 2 mm (longitudinal size)×2 mm (crosswise size) were prepared from each of the single crystal plates. Then, 25 Faraday rotators were drawn out of each single crystal plate. The crystal inside of each of the resulting Faraday rotators in total of 125 was observed with an infrared polarization microscope. No crystal defects were observed. Further, the optical loss of each Faraday rotator was assessed at the incidence of light at a wavelength of 1.55 μm. The optical loss with the minimum of 0.01 dB, the maximum of 0.05 dB and the typical value of 0.03 dB was obtained at high reproducibility.

Example 7

A CaMgZr-substituted GGG substrate mounted on a gold fixing device was charged in a furnace, of which the temperature was lowered to 866° C. Subsequently, the single face of the substrate was put in contact with a melt solution, for promoting the epitaxial growth for 40 hours. By the same procedures, a total of five single crystal wafers were grown to obtain magnetic garnet single crystal films of a film thickness of 530 to 560 μm. The compositions of the resulting single crystals were analyzed by the ICP analysis method. It was revealed that the compositions were $Bi_{0.8990}Gd_{1.6078}Yb_{0.4900}Na_{0.0030}Ca_{0.0002}Fe_{4.9991}Ge_{0.0009}O_{12}$. The value of the relation formula (Ge/(2Na+Ca)) was 0.15. The surface of the resulting Bi—Fe garnet single crystal films was observed. The single crystal films had gloss with less crystal defects.

The resulting individual single crystal wafers were polished and processed, to prepare five single crystal plates with a Faraday rotation angle of 45 deg. toward light at a wavelength of 1.55 μm. Then, an antireflection film was prepared on the polished face of each single crystal plate. Then, plural Faraday rotators each of 2 mm (longitudinal size)×2 mm (crosswise size) were prepared from each of the single crystal plates. Then, 25 Faraday rotators were drawn out of each single crystal plate. The crystal inside of each of the resulting Faraday rotators in total of 125 was observed with an infrared polarization microscope. No crystal defects were observed. Further, the optical loss of each Faraday rotator was assessed at the incidence of light at a wavelength of 1.55 μm. The optical loss with the minimum of 0.01 dB, the maximum of 0.08 dB and the typical value of 0.04 dB was obtained at high reproducibility. The optical loss was slightly increased.

Example 8

A CaMgZr-substituted GGG substrate mounted on a gold fixing device was charged in a furnace, of which the temperature was lowered to 876° C. Subsequently, the single face of the substrate was put in contact with a melt solution, for promoting the epitaxial growth for 40 hours. By the same procedures, a total of five single crystal wafers were grown to obtain magnetic garnet single crystal films of a film thickness of 530 to 560 μm. The compositions of the resulting single crystals were analyzed by the ICP analysis method. It was revealed that the compositions were $Bi_{0.8894}Gd_{1.6104}Yb_{0.4482}Na_{0.0020}Ca_{0.0500}Fe_{4.9460}Ge_{0.0540}O_{12}$. The value of the relation formula (Ge/(2Na+Ca)) was 1.00. The surface of the resulting Bi-substituted rare earth iron garnet single crystal films was observed. The single crystal films had gloss with less crystal defects.

The resulting individual single crystal wafers were polished and processed, to prepare five single crystal plates with a Faraday rotation angle of 45 deg. toward light at a wavelength of 1.55 μm. Then, an antireflection film was prepared on the polished face of each single crystal plate. Then, plural Faraday rotators each of 2 mm (longitudinal size)×2 mm (crosswise size) were prepared from each of the single crystal plates. Then, 25 Faraday rotators were drawn out of each single crystal plate. The crystal inside of each of the resulting Faraday rotators in total of 125 was observed with an infrared polarization microscope. No crystal defects were observed. Further, the optical loss of each Faraday rotator was assessed at the incidence of light at a wavelength of 1.55 μm. The optical loss with the minimum of 0.01 dB, the maximum of 0.08 dB and the typical value of 0.04 dB was obtained at high reproducibility. The optical loss was slightly increased.

Example 9

A CaMgZr-substituted GGG substrate mounted on a gold fixing device was charged in a furnace, of which the temperature was lowered to 845° C. Subsequently, the single face of the substrate was put in contact with a melt solution, for promoting the epitaxial growth for 40 hours. By the same procedures, a total of five single crystal wafers were grown to obtain magnetic garnet single crystal films of a film thickness of 530 to 560 μm. The compositions of the resulting single crystals were analyzed by the ICP analysis method. It was revealed that the compositions were $Bi_{0.8890}Gd_{1.6001}Yb_{0.4999}Na_{0.0100}Ca_{0.0010}Fe_{4.9895}Si_{0.0105}O_{12}$. The value of the relation formula (Si/(2Na+Ca)) was 0.50. The surface of the resulting Bi—Fe garnet single crystal films was observed. The single crystal films had gloss with less crystal defects.

The resulting individual single crystal wafers were polished and processed, to prepare five single crystal plates with a Faraday rotation angle of 45 deg. toward light at a wavelength of 1.55 μm. Then, an antireflection film was prepared on the polished face of each single crystal plate. Then, plural Faraday rotators each of 2 mm (longitudinal size)×2 mm (crosswise size) were prepared from each of the single crystal plates. Then, 25 Faraday rotators were drawn out of each single crystal plate. The crystal inside of each of the resulting Faraday rotators in total of 125 was observed with an infrared polarization microscope. No crystal defects were observed. Further, the optical loss of each Faraday rotator was assessed at the incidence of light at a wavelength of 1.55 μm. An extremely small optical loss with the minimum of 0.00 dB, the maximum of 0.02 dB and the typical value of 0.01 dB was obtained at high reproducibility.

Example 10

A CaMgZr-substituted GGG substrate mounted on a gold fixing device was charged in a furnace, of which the temperature was lowered to 846° C. Subsequently, the single face of the substrate was put in contact with a melt solution, for promoting the epitaxial growth for 40 hours. By the same procedures, a total of five single crystal wafers were grown to obtain magnetic garnet single crystal films of a film thickness of 530 to 560 μm. The compositions of the resulting single crystals were analyzed by the ICP analysis method. It was revealed that the compositions were $Bi_{0.9103}Gd_{1.5950}Yb_{0.4837}Na_{0.0100}Ca_{0.0010}Fe_{4.9895}Ti_{0.0105}O_{12}$. The value of the relation formula (Ti/(2Na+Ca)) was 0.50. The surface of the resulting Bi—Fe garnet single crystal films was observed. The single crystal films had gloss with less crystal defects.

The resulting individual single crystal wafers were polished and processed, to prepare five single crystal plates with a Faraday rotation angle of 45 deg. toward light at a wavelength of 1.55 μm. Then, an antireflection film was prepared on the polished face of each single crystal plate. Then, plural Faraday rotators each of 2 mm (longitudinal size)×2 mm (crosswise size) were prepared from each of the single crystal plates. Then, 25 Faraday rotators were drawn out of each single crystal plate. The crystal inside of each of the resulting Faraday rotators in total of 125 was observed with an infrared polarization microscope. No crystal defects were observed. Further, the optical loss of each Faraday rotator was assessed at the incidence of light at a wavelength of 1.55 μm. An extremely small optical loss with the minimum of 0.00 dB, the maximum of 0.02 dB and the typical value of 0.01 dB was obtained at high reproducibility.

Example 11

A CaMgZr-substituted GGG substrate mounted on a gold fixing device was charged in a furnace, of which the temperature was lowered to 845° C. Subsequently, the single face of the substrate was put in contact with a melt solution, for promoting the epitaxial growth for 40 hours. By the same procedures, a total of five single crystal wafers were grown to obtain magnetic garnet single crystal films of a film thickness of 530 to 560 μm. The compositions of the resulting single crystals were analyzed by the ICP analysis method. It was revealed that the compositions were $Bi_{0.8906}Gd_{1.6028}Yb_{0.4956}Na_{0.0100}Ca_{0.0010}Fe_{4.9895}Pt_{0.0105}O_{12}$. The value of the relation formula (Pt/(2Na+Ca)) was 0.50. The surface of the resulting Bi-substituted rare earth iron garnet single crystal films was observed. The single crystal films, had gloss with less crystal defects.

The resulting individual single crystal wafers were polished and processed, to prepare five single crystal plates with a Faraday rotation angle of 45 deg. toward light at a wavelength of 1.55 μm. Then, an antireflection film was prepared on the polished face of each single crystal plate. Then, plural Faraday rotators each of 2 mm (longitudinal size)×2 mm (crosswise size) were prepared from each of the single crystal plates. Then, 25 Faraday rotators were drawn out of each single crystal plate. The crystal inside of each of the resulting Faraday rotators in total of 125 was observed with an infrared polarization microscope. No crystal defects were observed. Further, the optical loss of each Faraday rotator was assessed at the incidence of light at a wavelength of 1.55 μm. An extremely small optical loss with the minimum of 0.00 dB, the maximum of 0.02 dB and the typical value of 0.01 dB was obtained at high reproducibility.

Example 12

A CaMgZr-substituted GGG substrate mounted on a gold fixing device was charged in a furnace, of which the temperature was lowered to 845° C. Subsequently, the single face of the substrate was put in contact with a melt solution, for promoting the epitaxial growth for 40 hours. By the same procedures, a total of five single crystal wafers were grown to obtain magnetic garnet single crystal films of a film thickness of 530 to 560 μm. The compositions of the resulting single crystals were analyzed by the ICP analysis method. It was revealed that the compositions were $Bi_{0.8912}Gd_{1.6056}Yb_{0.4922}Na_{0.0100}Ca_{0.0010}Fe_{4.9895}Ru_{0.0105}O_{12}$. The value of the relation formula (Ru/(2Na+Ca)) was 0.50. The surface of the resulting Bi—Fe garnet single crystal films was observed. The single crystal films had gloss with less crystal defects.

The resulting individual single crystal wafers were polished and processed, to prepare five single crystal plates with a Faraday rotation angle of 45 deg. toward light at a wavelength of 1.55 μm. Then, an antireflection film was prepared on the polished face of each single crystal plate. Then, plural Faraday rotators each of 2 mm (longitudinal size)×2 mm (crosswise size) were prepared from each of the single crystal plates. Then, 25 Faraday rotators were drawn out of each single crystal plate. The crystal inside of each of the resulting Faraday rotators in total of 125 was observed with an infrared polarization microscope. No crystal defects were observed. Further, the optical loss of each Faraday rotator was assessed at the incidence of light at a wavelength of 1.55 μm. An extremely small optical loss with the minimum of 0.00 dB, the maximum of 0.02 dB and the typical value of 0.01 dB was obtained at high reproducibility.

Example 13

A CaMgZr-substituted GGG substrate mounted on a gold fixing device was charged in a furnace, of which the temperature was lowered to 843° C. Subsequently, the single face of the substrate was put in contact with a melt solution, for promoting the epitaxial growth for 40 hours. By the same procedures, a total of five single crystal wafers were grown to obtain magnetic garnet single crystal films of a film thickness of 530 to 560 μm. The compositions of the resulting single crystals were analyzed by the ICP analysis method. It was revealed that the compositions were $Bi_{0.8897}Gd_{1.6100}Yb_{0.4893}Na_{0.0100}Ca_{0.0010}Fe_{4.9895}Sn_{0.0105}O_{12}$. The value of the relation formula (Sn/(2Na+Ca)) was 0.50. The surface of the resulting Bi—Fe garnet single crystal films was observed. The single crystal films had gloss with less crystal defects.

The resulting individual single crystal wafers were polished and processed, to prepare five single crystal plates with a Faraday rotation angle of 45 deg. toward light at a wavelength of 1.55 μm. Then, an antireflection film was prepared on the polished face of each single crystal plate. Then, plural Faraday rotators each of 2 mm (longitudinal size)×2 mm (crosswise size) were prepared from each of the single crystal plates. Then, 25 Faraday rotators were drawn out of each single crystal plate. The crystal inside of each of the resulting Faraday rotators in total of 125 was observed with an infrared polarization microscope. No crystal defects were observed. Further, the optical loss of each Faraday rotator was assessed at the incidence of light at a wavelength of 1.55 μm. An extremely small optical loss with the minimum of 0.00 dB, the maximum of 0.02 dB and the typical value of 0.01 dB was obtained at high reproducibility.

Example 14

A CaMgZr-substituted GGG substrate mounted on a gold fixing device was charged in a furnace, of which the temperature was lowered to 844° C. Subsequently, the single face of the substrate was put in contact with a melt solution, for promoting the epitaxial growth for 40 hours. By the same procedures, a total of five single crystal wafers were grown to obtain magnetic garnet single crystal films of a film thickness of 530 to 560 μm. The compositions of the resulting single crystals were analyzed by the ICP analysis method. It was revealed that the compositions were $Bi_{0.8943}Gd_{1.5998}Yb_{0.4949}Na_{0.0100}Ca_{0.0010}Fe_{4.9895}Hf_{0.0105}O_{12}$. The value of the relation formula (Hf/(2Na+Ca)) was 0.50. The surface of the resulting Bi—Fe garnet single crystal films was observed. The single crystal films had gloss with less crystal defects.

The resulting individual single crystal wafers were polished and processed, to prepare five single crystal plates with a Faraday rotation angle of 45 deg. toward light at a wavelength of 1.55 μm. Then, an antireflection film was prepared on the polished face of each single crystal plate. Then, plural Faraday rotators each of 2 mm (longitudinal size)×2 mm (crosswise size) were prepared from each of the single crystal plates. Then, 25 Faraday rotators were drawn out of each single crystal plate. The crystal inside of each of the resulting Faraday rotators in total of 125 was observed with an infrared polarization microscope. No crystal defects were observed. Further, the optical loss of each Faraday rotator was assessed at the incidence of light at a wavelength of 1.55 μm. An extremely small optical loss with the minimum of 0.00 dB, the maximum of 0.02 dB and the typical value of 0.01 dB was obtained at high reproducibility.

Example 15

A CaMgZr-substituted GGG substrate mounted on a gold fixing device was charged in a furnace, of which the temperature was lowered to 845° C. Subsequently, the single face of the substrate was put in contact with a melt solution, for promoting the epitaxial growth for 40 hours. By the same procedures, a total of five single crystal wafers were grown to obtain magnetic garnet single crystal films of a film thickness of 530 to 560 μm. The compositions of the resulting single crystals were analyzed by the ICP analysis method. It was revealed that the compositions were $Bi_{0.8967}Gd_{1.5989}Yb_{0.4934}Na_{0.0100}Ca_{0.0010}Fe_{4.9895}Zr_{0.0105}O_{12}$. The value of the relation formula (Zr/(2Na+Ca)) was 0.50. The surface of the resulting Bi—Fe garnet single crystal films was observed. The single crystal films had gloss with less crystal defects.

The resulting individual single crystal wafers were polished and processed, to prepare five single crystal plates with a Faraday rotation angle of 45 deg. toward light at a wavelength of 1.55 μm. Then, an antireflection film was prepared on the polished face of each single crystal plate. Then, plural Faraday rotators each of 2 mm (longitudinal size)×2 mm (crosswise size) were prepared from each of the single crystal plates. Then, 25 Faraday rotators were drawn out of each single crystal plate. The crystal inside of each of the resulting Faraday rotators in total of 125 was observed with an infrared polarization microscope. No crystal defects were observed. Further, the optical loss of each Faraday rotator was assessed at the incidence of light at a wavelength of 1.55 μm. An extremely small optical loss with the minimum of 0.00 dB, the maximum of 0.02 dB and the typical value of 0.01 dB was obtained at high reproducibility.

Example 16

A CaMgZr-substituted GGG substrate mounted on a gold fixing device was charged in a furnace, of which the temperature was lowered to 845° C. Subsequently, the single face of the substrate was put in contact with a melt solution, for promoting the epitaxial growth for 40 hours. By the same procedures, a total of five single crystal wafers were grown to obtain magnetic garnet single crystal films of a film thickness of 530 to 560 μm. The compositions of the resulting single crystals were analyzed by the ICP analysis method. It was revealed that the compositions were $Bi_{0.9007}Gd_{1.6013}Yb_{0.4870}Na_{0.0100}Sr_{0.0010}Fe_{4.9895}Ge_{0.0105}O_{12}$. The value of the relation formula (Ge/(2Na+Sr)) was 0.50. The surface of the resulting Bi—Fe garnet single crystal films was observed. The single crystal films had gloss with less crystal defects.

The resulting individual single crystal wafers were polished and processed, to prepare five single crystal plates with a Faraday rotation angle of 45 deg. toward light at a wavelength of 1.55 μm. Then, an antireflection film was prepared on the polished face of each single crystal plate. Then, plural Faraday rotators each of 2 mm (longitudinal size)×2 mm (crosswise size) were prepared from each of the single crystal plates. Then, 25 Faraday rotators were drawn out of each single crystal plate. The crystal inside of each of the resulting Faraday rotators in total of 125 was observed with an infrared polarization microscope. No crystal defects were observed. Further, the optical loss of each Faraday rotator was assessed at the incidence of light at a wavelength of 1.55 μm. An extremely small optical loss with the minimum of 0.00 dB, the maximum of 0.02 dB and the typical value of 0.01 dB was obtained at high reproducibility.

Example 17

A CaMgZr-substituted GGG substrate mounted on a gold fixing device was charged in a furnace, of which the temperature was lowered to 846° C. Subsequently, the single face of the substrate was put in contact with a melt solution, for promoting the epitaxial growth for 40 hours. By the same procedures, a total of five single crystal wafers were grown to obtain magnetic garnet single crystal films of a film thickness of 530 to 560 μm. The compositions of the resulting single crystals were analyzed by the ICP analysis method. It was revealed that the compositions were $Bi_{0.9089}Gd_{1.6078}Yb_{0.4733}Na_{0.0100}Fe_{4.9885}Mg_{0.0010}Ge_{0.0105}O_{12}$. The value of the relation formula (Ge/(2Na+Mg)) was 0.50. The surface of the resulting Bi—Fe garnet single crystal films was observed. The single crystal films had gloss with less crystal defects.

The resulting individual single crystal wafers were polished and processed, to prepare five single crystal plates with a Faraday rotation angle of 45 deg. toward light at a wavelength of 1.55 μm. Then, an antireflection film was prepared on the polished face of each single crystal plate. Then, plural Faraday rotators each of 2 mm (longitudinal size)×2 mm (crosswise size) were prepared from each of the single crystal plates. Then, 25 Faraday rotators were drawn out of each single crystal plate. The crystal inside of each of the resulting Faraday rotators in total of 125 was observed with an infrared polarization microscope. No crystal defects were observed. Further, the optical loss of each Faraday rotator was assessed at the incidence of light at a wavelength of 1.55 μm. An extremely small optical loss with the minimum of 0.00 dB, the maximum of 0.02 dB and the typical value of 0.01 dB was obtained at high reproducibility.

Example 18

A CaMgZr-substituted GGG substrate mounted on a gold fixing device was charged in a furnace, of which the temperature was lowered to 846° C. Subsequently, the single face of the substrate was put in contact with a melt solution, for promoting the epitaxial growth for 40 hours. By the same procedures, a total of five single crystal wafers were grown to obtain magnetic garnet single crystal films of a film thickness of 530 to 560 μm. The compositions of the resulting single crystals were analyzed by the ICP analysis method. It was revealed that the compositions were $Bi_{0.9048}Gd_{1.6082}Yb_{0.4765}Na_{0.0100}Ca_{0.0005}Fe_{4.9890}Mg_{0.0005}Ge_{0.0055}Ti_{0.0050}O_{12}$ The value of the relation formula ((Ge+Ti)/(2Na+Ca+Mg)) was 0.50. The surface of the resulting Bi—Fe garnet single crystal films was observed. The single crystal films had gloss with less crystal defects.

The resulting individual single crystal wafers were polished and processed, to prepare five single crystal plates with a Faraday rotation angle of 45 deg. toward light at a wavelength of 1.55 μm. Then, an antireflection film was prepared on the polished face of each single crystal plate. Then, plural Faraday rotators each of 2 mm (longitudinal size)×2 mm (crosswise size) were prepared from each of the single crystal plates. Then, 25 Faraday rotators were drawn out of each single crystal plate. The crystal inside of each of the resulting Faraday rotators in total of 125 was observed with an infrared polarization microscope. No crystal defects were observed. Further, the optical loss of each Faraday rotator was assessed at the incidence of light at a wavelength of 1.55 μm. An extremely small optical loss with the minimum of 0.00 dB, the maximum of 0.02 dB and the typical value of 0.01 dB was obtained at high reproducibility.

Example 19

A CaMgZr-substituted GGG substrate mounted on a gold fixing device was charged in a furnace, of which the temperature was lowered to 831° C. Subsequently, the single face of the substrate was put in contact with a melt solution, for promoting the epitaxial growth for 40 hours. By the same procedures, a total of five single crystal wafers were grown to obtain magnetic garnet single crystal films of a film thickness of 500 to 520 μm. The compositions of the resulting single crystals were analyzed by the ICP analysis method. It was revealed that the compositions were $Bi_{1.0200}Tb_{1.8991}Ho_{0.0699}Na_{0.0100}Ca_{0.0010}Fe_{4.9895}Ge_{0.0105}O_{12}$. The value of the relation formula (Ge/(2Na+Ca)) was 0.50. The surface of the resulting Bi—Fe garnet single crystal films was observed. The single crystal films had gloss with less crystal defects.

The resulting individual single crystal wafers were polished and processed, to prepare five single crystal plates with a Faraday rotation angle of 45 deg. toward light at a wavelength of 1.31 μm. Then, an antireflection film was prepared on the polished face of each single crystal plate. Then, plural Faraday rotators each of 2 mm (longitudinal size)×2 mm (crosswise size) were prepared from each of the single crystal plates. Then, 25 Faraday rotators were drawn out of each single crystal plate. The crystal inside of each of the resulting Faraday rotators in total of 125 was observed with an infrared polarization microscope. No crystal defects were observed. Further, the optical loss of each Faraday rotator was assessed at the incidence of light at a wavelength of 1.31 μm. An extremely small optical loss with the minimum of 0.00 dB, the maximum of 0.02 dB and the typical value of 0.01 dB was obtained at high reproducibility.

Example 20

A CaMgZr-substituted GGG substrate mounted on a gold fixing device was charged in a furnace, of which the temperature was lowered to 886° C. Subsequently, the single face of the substrate was put in contact with a melt solution, for promoting the epitaxial growth for 60 hours. By the same procedures, a total of five single crystal wafers were grown to obtain magnetic garnet single crystal films of a film thickness of 840 to 870 μm. The compositions of the resulting single crystals were analyzed by the ICP analysis method. It was revealed that the compositions were $Bi_{0.6014}Eu_{1.7121}Y_{0.6755}Na_{0.0100}Ca_{0.0010}Fe_{4.9895}Ge_{0.0105}O_{12}$. The value of the relation formula (Ge/(2Na+Ca)) was 0.50. The surface of the resulting Bi—Fe garnet single crystal films was observed. The single crystal films had gloss with less crystal defects.

The resulting individual single crystal wafers were polished and processed, to prepare five single crystal plates with a Faraday rotation angle of 45 deg. toward light at a wavelength of 1.55 μm. Then, an antireflection film was prepared on the polished face of each single crystal plate. Then, plural Faraday rotators each of 2 mm (longitudinal size)×2 mm (crosswise size) were prepared from each of the single crystal plates. Then, 25 Faraday rotators were drawn out of each single crystal plate. The crystal inside of each of the resulting Faraday rotators in total of 125 was observed with an infrared polarization microscope. No crystal defects were observed. Further, the optical loss of each Faraday rotator was assessed at the incidence of light at a wavelength of 1.55 am. An extremely small optical loss with the minimum of 0.00 dB, the maximum of 0.02 dB and the typical value of 0.01 dB was obtained at high reproducibility.

Example 21

A CaMgZr-substituted GGG substrate mounted on a gold fixing device was charged in a furnace, of which the temperature was lowered to 774° C. Subsequently, the single face of the substrate was put in contact with a melt solution, for promoting the epitaxial growth for 32 hours. By the same procedures, a total of five single crystal wafers were grown to obtain magnetic garnet single crystal films of a film thickness of 390 to 420 μm. The compositions of the resulting single crystals were analyzed by the ICP analysis method. It was revealed that the compositions were $Bi_{0.4999}Gd_{0.7032}Lu_{0.7859}Na_{0.0100}Ca_{0.0010}Fe_{4.9895}Ge_{0.0105}O_{12}$. The value of the relation formula (Ge/(2Na+Ca)) was 0.50. The surface of the resulting Bi—Fe garnet single crystal films was observed. The single crystal films had gloss with less crystal defects.

The resulting individual single crystal wafers were polished and processed, to prepare five single crystal plates with a Faraday rotation angle of 45 deg. toward light at a wavelength of 1.55 μm. Then, an antireflection film was prepared on the polished face of each single crystal plate. Then, plural Faraday rotators each of 2 mm (longitudinal size)×2 mm (crosswise size) were prepared from each of the single crystal plates. Then, 25 Faraday rotators were drawn out of each single crystal plate. The crystal inside of each of the resulting Faraday rotators in total of 125 was observed with an infrared polarization microscope. No crystal defects were observed. Further, the optical loss of each Faraday rotator was assessed at the incidence of light at a wavelength of 1.55 μm. An extremely small optical loss with the minimum of 0.00 dB, the maximum of 0.02 dB and the typical value of 0.01 dB was obtained at high reproducibility.

Comparative Example 1

A CaMgZr-substituted GGG substrate mounted on a gold fixing device was charged in a furnace, of which the temperature was lowered to 864° C. Subsequently, the single face of the substrate was put in contact with a melt solution, for promoting the epitaxial growth for 40 hours. By the same procedures, a total of five single crystal wafers were grown to obtain magnetic garnet single crystal films of a film thickness of 540 to 570 μm. The compositions of the resulting single crystals were analyzed by the ICP analysis method. It was revealed that the compositions were $Bi_{0.9001}Gd_{1.6023}Yb_{0.4936}Na_{0.0040}Fe_{4.9920}Ge_{0.0080}O_{12}$. The value of the relation formula (Ge/(2Na)) was 1.00. The surface of the resulting Bi—Fe garnet single crystal films was observed. The single crystal films had gloss with less crystal defects.

The resulting individual single crystal wafers were polished and processed, to prepare five single crystal plates with a Faraday rotation angle of 45 deg. toward light at a wavelength of 1.55 µm. Then, an antireflection film was prepared on the polished face of each single crystal plate. Then, plural Faraday rotators each of 2 mm (longitudinal size)×2 mm (crosswise size) were prepared from each of the single crystal plates. Then, 25 Faraday rotators were drawn out of each single crystal plate. The crystal inside of each of the resulting Faraday rotators in total of 125 was observed with an infrared polarization microscope. No crystal defects were observed. Further, the optical loss of each Faraday rotator was assessed at the incidence of light at a wavelength of 1.55 µm. The large optical loss with the minimum of 0.01 dB, the maximum of 0.09 dB and the typical value of 0.05 dB was obtained. It was confirmed that the reproducibility of the optical loss was likely deteriorated.

FIG. 1 collectively shows the types of the elements M1, M2 or Mg and M3, and the Na amount $\beta$, the M2 amount $\gamma$, the Mg amount $\delta$, the M3 amount E along with the values of the relation formula (M3/(2Na+M2+Mg)) in the Examples and the Comparative Example. Additionally, FIG. 2 shows the optical losses (dB) of the prepared Faraday rotators and the reproducibility of the optical losses in the Examples and the Comparative Example.

As shown in FIGS. 1 and 2, the optical loss of a Faraday rotator prepared from a magnetic single crystal represented by the chemical formula $Bi_\alpha Na_\beta M1_{3-\beta-\gamma} M2_\gamma Fe_{5-\delta-\epsilon} Mg_\delta M3_\epsilon O_{12}$ (M1 is at least one element or more selected from Y, Eu, Gd, Tb, Dy, Ho, Yb and Lu; and M2 is at least one element or more selected from Ca and Sr; M3 is at least one element or more selected from Si, Ge, Ti, Pt, Ru, Sn, Hf and Zr, provided that $0.60<\alpha\leq1.50$, $0<\beta\leq0.05$, $1.35<3-\alpha-\beta-\gamma<2.40$, $0\leq\gamma\leq0.10$, $0\leq\delta\leq0.10$, $0<\epsilon\leq0.10$, $0<\gamma+\delta\leq0.10$, $0<\delta+\epsilon\leq0.10$) can be reduced at high reproducibility. When the value of the relation formula (M3/(2Na+M2+Mg)) is within a range larger than 0 but not 1.00 or more, the optical loss of the resulting Faraday rotator (see Examples 1 through 21 and Comparative Example 1).

When the value of the relation formula (M3/(2Na+M2+Mg)) is within a range of 0.20 or more too 0.95 or less, a Faraday rotator with a sufficiently small optical loss of 0.05 dB or less can be prepared at high reproducibility (see Examples 1 through 6 and Examples 9 through 21.) When the value of the relation formula (M3/(2Na+M2+Mg)) is 0.30 or more to 0.90 or less, a Faraday rotator with an extremely small optical loss of 0.03 dB or less can be prepared at high reproducibility (see Examples 1 through 4 and Examples 9 through 21.)

What is claimed is:

1. A magnetic garnet single crystal represented by a chemical formula $Bi_\alpha Na_\beta M1_{3-\alpha-\beta-\gamma} M2_\gamma Fe_{5-\delta-\epsilon} Mg_\delta M3_\epsilon O_{12}$, wherein M1 is at least one element or more selected from Y, Eu, Gd, Tb, Dy, Ho, Yb and Lu, M2 is at least one element or more selected from Ca and Sr, M3 is at least one element or more selected from Si, Ge, Ti, Pt, Ru, Sn, Hf and Zr, $0.60<\alpha\leq1.50$, $1.35<3-\alpha-\beta-\gamma<2.40$, $0\leq\gamma\leq0.10$, $0\leq\delta\leq0.10$, $0<\epsilon\leq0.10$, $0<\gamma+\delta\leq0.10$, and $0<\delta+\epsilon\leq0.10$.

2. The magnetic garnet single crystal according to claim 1, where the magnetic garnet single crystal satisfies the formula $0<\epsilon/(2\beta+\gamma+\delta)\leq1.00$.

3. The magnetic garnet single crystal according to claim 1, where magnetic garnet single crystal satisfies the formula $0.20\leq\epsilon/(2\beta+\gamma+\delta)\leq0.95$.

4. The magnetic garnet single crystal according to claim 1, where the magnetic garnet single crystal satisfies the formula $0.30\leq\epsilon/(2\beta+\gamma+\delta)\leq0.90$.

5. A Faraday rotator prepared from a magnetic garnet single crystal according to claim 1.

6. A Faraday rotator prepared from a magnetic garnet single crystal according to claim 2.

7. A Faraday rotator prepared from a magnetic garnet single crystal according to claim 3.

8. A Faraday rotator prepared from a magnetic garnet single crystal according to claim 4.

* * * * *